United States Patent Office 3,729,316
Patented Apr. 24, 1973

3,729,316
OPTIMIZED GLASS PHOTOGRAPHIC MASK

Paul P. Castrucci, Poughkeepsie, Nadim F. Haddad, Hopewell Junction, and Raymond P. Pecoraro, Poughkeepsie, N.Y., assignors to International Business Machines Corporation, Armonk, N.Y.

No Drawing. Filed Feb. 17, 1970, Ser. No. 12,150
Int. Cl. G03c 5/00
U.S. Cl. 96—36.2 2 Claims

ABSTRACT OF THE DISCLOSURE

A process for making a photographic optical glass mask that is used in silicon integrated circuit wafer processing. An optical glass mask is made by means of a step and repeat camera. Displacement error which is caused by the difference in coefficients of expansion between the microset scale of the step and repeat camera and the photographic optical mask, is minimized by using the same material for both elements. Further displacement error caused by thermal mismatch of the optical glass mask and the silicon wafer is minimized by using a borosilicate glass mask having a linear coefficient of expansion of $3.5 \times 10^{-6}$/degrees C., which substantially matches the linear coefficient of expansion of the silicon wafer material.

BACKGROUND OF THE INVENTION

The present invention relates to integrated circuit manufacture, and more particularly to a method of optical mask fabrication which minimized the errors due to thermal effects.

In the manufacture of semiconductor devices, it has been found that by means of photolithography, it is possible to achieve fabrication of large numbers of units simultaneously in an integrated circuit form. A wafer which comprises the integrated circuit is typically in the vicinity of 2¼ inch diameter which may represent a batch of identical products numbering from 100 to several thousand units. To achieve this compactness, it is necessary to perform various fabrication processes in minute selected areas over the entire wafer while the balance of the area is virtually unaffected. Selection of these various areas is usually controlled by means of a mask. Thus, it is necessary to have a series of masks in order to implement the complete processing of the wafer.

In the process of making a photographic glass mask which may be used in the wafer manufacturing process, it is necessary to make a work plate mask from a master photomask. That is, the master photomask is used to make numerous copies of the master for production use. These copies are generally known as submasters. Then, by a further contact printing step, work plates are produced which will be used to expose the photoresist material on the silicon wafer. For the purpose of this specification the terms photomask and photographic mask are interchangeable and refer to either the master, submaster or workplate referred to above.

In the present state of the art, these photomasks may consist of a developed photographic emulsion or thin opaque metallic films deposited on optically flat soda lime glass to selectively expose a photoresist substrate.

It is this mask which is used on a wafer substrate. For example, a silicon wafer which is coated with a photoresist is aligned with a pattern mask and then light is passed through the light and dark areas of the mask in order to expose the photoresist on the silicon wafer. Then, by further processing, the photoresist is developed so as to enable the removal of undesired photoresist film so as to result in a circuit pattern.

Methods of making photographic masks are generally well known in the art. For example several methods are disclosed in the following texts: Integrated Circuits Engineering—Basic Technology, by the Staff of Integrated Circuit Engineering Corp., Boston Technical Publishers, 1966; M. Fogiel, Microelectronics-Principles-Design Techniques-Fabrication Processes, Research and Education Association, 1968. One of the more common methods is the step and repeat technique, which makes use of a standard step and repeat camera such as the type manufactured by the David W. Mann Company. This technique of photographic mask manufacture produces a two dimensional array of images by a multiplicity.

Each exposure forms a single image in the array. The exposure may be made by either the contact method or the projection method. If the projection method is used, then the single integrated circuit pattern image is usually photographically reduced onto the mask plate being exposed during the step and repeat process. After every exposure, the exposed mask plate is shifted by moving a stepping table on which the plate rests in an X—Y coordinate system. Movement of the stepping table may be controlled by either program or mechanical means.

Commercially available steps and repeat cameras employ a counter controller that programs and controls the exposure and spacing. Also, a microset scale is used as a further control of the linear motion of the spacing of the camera.

In general, prior art silicon wafer manufacturing processes did not encounter serious problems due to changes in the temperature of the environment in either the mask manufacturing process or in the exposure of the silicon wafer by the mask. This is so because the usually experienced tolerance of .1 mil across a 2¼-inch wafer, within a temperature variation of ±3° C. was considered to be acceptable with respect to the size of the circuits present on the wafer. However, with the advent of greater compactness and an increasing need for further microminiaturization of the circuit areas on the wafer, it has been necessary to achieve more precise tolerances. Up to the present state of the art, it is only possible to control these tolerances by means of effecting the environmental temperature changes so as to limit the expansion of the soda lime glass materials which are used as the support surface for the opaque circuit pattern of the mask.

It is therefore a primary object of the present invention to provide an improved photomask to be used in photolithographic silicon wafer processing.

Another object of the present invention is to reduce the adverse effect of environmental temperature changes in the making of photomasks that are used in silicon wafer manufacturing processes.

A further object of the present invention is to reduce displacement errors caused by the differential thermal expansion between the photographic glass masks and the silicon wafer substrate.

It is a further object of the present invention to match the linear coefficient of expansion of the microset scale in a step and repeat camera with the linear coefficient of expansion of the photomask material and further to match this coefficient of expansion with that of the silicon wafer material so as to minimize image displacement errors due to differentials in thermal expansion of these materials.

It is a further object of the present invention to use a photomask made of borosilicate glass having a linear coefficient of expansion substantially similar to the linear coefficient of expansion of the silicon wafer material on which the mask will be exposed.

SUMMARY OF THE INVENTION

The present mask fabrication techniques exhibit a certain amount of mismatch in the laying out of the array by means of the step and repeat camera due to thermal effects on the microset scale. Furthermore, there is a tolerance error due to the effect of temperature differences between the silicon wafer material and the mask material.

The microset scale of the step and repeat camera, causes thermal error as a result of the coefficient of expansion of the microset scale being different than the linear coefficient of expansion of the mask material. Therefore, the error in the size of the mask is compensated for by the expansion of the scale by making the scale and the mask material have the same linear coefficient of expansion. This may be achieved by using the same material for both.

Furthermore, in considering the temperature differences between the silicon substrate and the mask, image errors due to this differential are reduced by using a mask material having a substantially similar coefficient of expansion to silicon. The material which is used to satisfy this criteria is borosilicate glass, generally known as Pyrex (registered trademark of Corning Glass Works), which has a thermal coefficient of expansion of $3.5\times10^{-6}/°$ C. Furthermore, both the microset scale and the mask material are comprised of borosilicate glass thereby substantially reducing thermal image displacement error.

THEORETICAL ANALYSIS

In the generation of a master mask using a step and repeat camera, the effect of expansion in the original single segment slide containing the single integrated circuit pattern image is negligible, since it takes place over a chip length rather than over a large wafer diameter.

If the camera's microset scale is made of the same material as the masks, the error in the size of the master mask is compensated by the expansion of the scale; if not, an error resulting from the different expansion of scale and master will result in generating masters with different sizes. This effect is analyzed to determine maximum error in the following manner.

Let the temperature in the mask fabrication area be held within $\pm\Delta t_f$ (° C.) of $t_f$. Furthermore, assume that the temperature of the camera scale and plates follow room temperature. If a master of intended size "$d$" is shot at $t_f+\Delta t_f$, its size at the reference temperature $t_f$ is offset by $\pm\delta_f$ (the error introduced due to difference of expansion between microset scale and master mask plate), depending upon whether the plate expands less than the scale or vice-versa; then, $$\delta_f = d\Delta t_f|C_c - C_m|$$

where $C_c$ and $C_m$ are the coefficients of thermal expansion of the camera scale and mask, respectively. If both the scale and plate are made of the same material, $\delta_f=0$ and all masters are the same size.

Similarly, if the master is shot at $t_f-\Delta t_f$, the $t_f$ size would be offset by $\pm\delta_f$. The maximum variation in the size of any two masters at the same temperature, therefore is $2\delta_f$.

The smallest size submaster would be generated from the smallest size master at $t_f-\Delta t_f$. The pattern size at that temperature would be $d-\delta_f-dc_m\Delta t_f$. The extra term being due to cooling the master by $\Delta t_f$. At the reference temperature of $t_f$, the smallest submaster would then have an expanded pattern size of $d-\delta_f$, the same as the smallest size master.

The maximum size pattern on any submaster would be generated through the use of the maximum size master $(d+\delta_f)$ at the maximum temperature possible $(t_f+\Delta t_f)$. The pattern size would then be $d+\delta_f+dC_m\Delta t_f$, which reduces to $d+\delta_f$ at $t_f$ temperature.

The same argument holds for the generation of work plates from the submasters. The maximum variation in the pattern size on any two work plates at any one temperature, therefore, is $2\delta_f$.

Now assuming that the temperature in the wafer exposure area can vary from $t_e-\Delta t_e$ to $t_e+\Delta t_e$, the incremental expansion in the pattern size on any mask due to $\Delta t_e$ is then $\delta_{em}=dC_m\Delta t_e$. The corresponding expansion of any pattern of dimension "$d$" on the wafer would be governed by the expansion of silicon. Let $\delta_{ew}=dC_w\Delta t_e$, where $C_w$ is the thermal expansion coefficient of the silicon wafer at room temperature. Then, if $C_m>C_w$, it could be seen that a maximum mismatch, $\overline{E}$, between any two consecutive patterns occurs when the smallest size mask $(d-\delta_f)$ is exposed at the lowest temperature $(t_e-\Delta t_e)$, while the next pattern uses the maximum size mask $(d+\delta_f)$ at maximum temperature $(t_e+\Delta t_e)$.

The size of the smallest mask pattern at $t_e-\Delta t_e$ is $d-\delta_f-\delta_{em}$. This pattern is transferred to the silicon wafer. When the next pattern is exposed at $t_e+\Delta t_e$, the size of the initial pattern becomes $d-\delta_f-\delta_{em}+2\delta_{ew}$. The additional $2\delta_{ew}$ term is the expansion of the silicon wafer due to $2\Delta t_e$ increase in temperature. At that temperature, the maximum size mask pattern becomes $d+\delta_f+\delta_{em}$. Therefore, $$\overline{E}=(d+\delta_f+\delta_{em})-(d-\delta_f-\delta_{em}+2\delta_{ew})=2\delta_f+2(\delta_{em}-\delta_{ew})$$

where $C_m>C_w$. Then, for the general condition:

$$\overline{E}=2\delta_f+2|\delta_{em}-\delta_{ew}|$$
$$=2d\Delta t_f|C_c-C_m|+2d\Delta t_e|C_m-C_w|$$

The second term being due to the difference in the expansion coefficient between mask and wafer. If these coefficients were the same, the second term would vanish and the maximum mismatch would be the same as that on the mask pattern. Therefore, to minimize the mismatch between patterns, the linear coefficient of thermal expansion of the mask material as well as the scale on the step and repeat camera should be close as possible to that of silicon.

APPLICATION

The maximum mismatch, $\overline{E}$, could be rewritten as $\overline{E}=\overline{E}_f+\overline{E}_e$, where $$\overline{E}_f=2d\Delta t_f|C_c-C_m|$$
=Mask fabrication area contribution $$\overline{E}=2d\Delta t_e|C_m-C_w|$$
=Exposure area contribution.

At present, soda-lime glass is used in photographic mask fabrication. The thermal expansion coefficient of this material is three and a half times as great as that of silicon. This results in a relatively large mismatch between patterns. To minimize this mismatch, it is necessary to use a material with a linear coefficient of expansion substantially similar to that of silicon. This is achieved by using borosilicate glass, generally known as Pyrex, which has a coefficient of expansion of $3.5\times10^{-6}/°$ C.

Table I lists the values of $\overline{E}_f$ for different temperature control tolerances in the mask fabrication area, while Table II lists the values of $\overline{E}_e$ for different temperature control tolerances in the exposure (photo-resist) area.

The following parameters were used in deriving the values in Tables I and II.

d=diameter of wafer=2¼ in.
Thermal expansion coefficient of soda-lime glass $=9.2\times10^{-6}/°$ C.
Thermal expansion coefficient of Pyrex glass $=3.5\times10^{-6}/°$ C.
Thermal expansion coefficient of silicon$=2.6\times10^{-6}/°$ C.

TABLE IV.—MAXIMUM MISMATCH, n (MILS), DUE TO TEMPERATURE DIFFERENCE BETWEEN WAFER AND MASK

| Mask material | $\lvert t_m-t_w\rvert$ (° C.) | | | | |
|---|---|---|---|---|---|
| | 1.0 | 2.0 | 3.0 | 4.0 | 5.0 |
| Sodalime glass | 0.021 | 0.041 | 0.062 | 0.083 | 0.104 |
| Pyrex glass | 0.008 | 0.016 | 0.024 | 0.032 | 0.039 |

While the invention has been particularly shown and described with reference to the preferred embodiment TABLE I.—MASK FABRICATION AREA CONTRIBUTION TO MISMATCH, $\bar{E}_f$ (MILS), VERSUS ROOM TEMPERATURE CONTROL

| Stop and repeat camera scale | Mask material | $\Delta t_f$ (° C.) | | | | |
|---|---|---|---|---|---|---|
| | | ±1 | ±2 | ±3 | ±4 | ±5 |
| Sodalime glass | Sodalime glass | 0.000 | 0.000 | 0.000 | 0.000 | 0.000 |
| | Pyrex glass | 0.026 | 0.051 | 0.077 | 0.103 | 0.128 |
| Borosilicate glass | Sodalime glass | 0.026 | 0.051 | 0.077 | 0.103 | 0.128 |
| | Borosilicate glass | 0.000 | 0.000 | 0.000 | 0.000 | 0.000 |

TABLE II.—EXPOSURE AREA CONTRIBUTION TO MISMATCH, $\bar{E}_e$ (MILS), VERSUS ROOM TEMPERATURE CONTROL

| Mask material | $\Delta t_e$ (° C.) | | | | |
|---|---|---|---|---|---|
| | ±1 | ±2 | ±3 | ±4 | ±5 |
| Sodalime glass | 0.030 | 0.059 | 0.089 | 0.119 | 0.149 |
| Borosilicate glass | 0.004 | 0.008 | 0.012 | 0.016 | 0.020 |

It is clear from the data in the tables that the best result is achieved if both the scale and masks are made of Pyrex glass, because the thermal expansion coefficient of Pyrex glass is the closest to that of silicon.

Now, in considering the temperature differences between the microset scale of the step and repeat camera and the master mask plate and between the work plate and the wafer, it will be assumed that the scale and mask are made of the same kind of glass (borosilicate).

Let $t_c$=temperature of the camera scale; $t_m$= master plate temperature; then, $n_f=dC_m|t_c-t_m|$=induced mismatch.

The mismatch $n_f$ is also introduced when generating the submasters if there is a temperature difference between the submaster and the master. It is also introduced when work plates are generated. This effect is additive (or subtractive).

In the exposure area, and for $C_m>C_w$, the worst case expansion occurs when the wafer temperature is held constant while the temperature of the mask varies. If $t_w$ is the wafer temperature and $t_m$ is the mask temperature, then:

$n_e=dC_m|t_m-t_w|$=induced mismatch (exposure area component).

Then, for the general case:

$n_e$=greater of $dC_m|t_m-t_w|$ or $dC_w|t_m-t_w|$.

By reference to Tables III and IV which list $n_f$ and $n_e$ for several temperature differences, it is clear that the use of borosilicate glass masks produces substantially less mismatch than that encountered with soda-lime masks.

TABLE III.—MAXIMUM MISMATCH, (MILS $n_f$), DUE TO TEMPERATURE DIFFERENCE BETWEEN CAMERA SCALE AND MASTER MASK, OR BETWEEN MASK PLATES DURING CONTACT PRINTING

| Mask material | $\lvert t_c-t_m\rvert$ (° C.) | | | | |
|---|---|---|---|---|---|
| | 1.0 | 2.0 | 3.0 | 4.0 | 5.0 |
| Sodalime glass | 0.021 | 0.041 | 0.062 | 0.083 | 0.104 |
| Borosilicate glass | 0.008 | 0.016 | 0.024 | 0.032 | 0.039 |

thereof, it will be understood by those skilled in the art that various changes in form and detail may be made therein without departing from the spirit and scope of the invention.

What I claim is:

1. In a process for making a photolithographic mask for use in the manufacture of silicon wafer integrated circuits, wherein the photographic emulsion on said mask is exposed with a plurality of images of the integrated circuit by means of a step and repeat camera and the photographic emulsion on the silicon wafer is exposed with a plurality of images of the integrated circuit by means of contact printing through said mask, the improvement comprising:

supporting the photographic emulsion on said mask with a plate of borosilicate glass having a linear coefficient of thermal expansion substantially similar to the coefficient of expansion of the silicon wafer, indexing said step and repeat camera with respect to said mask by means of a microset scale composed of a borosilicate glass having a linear coefficient of thermal expansion substantially similar to the coefficient of expansion of the silicon wafer, whereby the size of the plurality of images of the integrated circuit to which the silicon wafer is exposed, is independent of differences in the temperature at which each photographic exposure step was executed.

2. In a process for making photolithographic masks for use in the manufacture of silicon wafer integrated circuits, wherein the photographic emulsion on a master mask is exposed with a plurality of images of the integrated circuit by means of a step and repeat camera, the photographic emulsion on a submaster mask is exposed with said plurality of images of the integrated circuit by contact printing through said master mask, the photographic emulsion on a work plate mask is exposed with said plurality of images of the integrated circuit by contact printing through said submaster mask, and the photographic emulsion on the silicon wafer is exposed with a plurality of images of the integrated circuit by contact printing through said work plate mask, the improvement comprising:

supporting the photographic emulsion on said master mask with a plate of borosilicate glass having a linear coefficient of thermal expansion substantially similar to the coefficient of expansion of the silicon wafer, indexing said step and repeat camera with respect to said master mask by means of a microset scale composed of a borosilicate glass having a linear coefficient of thermal expansion substantially similar to the coefficient of expansion of the silicon wafer, supporting the photographic emulsion on said submaster mask with a plate of borosilicate glass having a linear coefficient of thermal expansion substantially similar to the coefficient of expansion of the silicon wafer, supporting the photographic emulsion on said work plate mask with a plate of borosilicate glass having a linear coefficient of thermal expansion substantially similar to the coefficient of expansion of the silicon wafer, whereby the size of the plurality of images of the integrated circuit to which the silicon wafer is exposed is independent of differences in the temperature at which each photographic exposure step was executed.

References Cited

UNITED STATES PATENTS

| | | | |
|---|---|---|---|
| 3,567,447 | 3/1971 | Chand | 96—38.3 |
| 3,355,291 | 11/1967 | Baird et al. | 96—38.4 |

NORMAN G. TORCHIN, Primary Examiner

J. L. GOODROW, Assistant Examiner

U.S. Cl. X.R.

96—27